(12) United States Patent
Burr et al.

(10) Patent No.: US 8,698,044 B2
(45) Date of Patent: Apr. 15, 2014

(54) TEXTILE STRUCTURES FOR HEATING OR WARMING

(75) Inventors: Stacey B. Burr, West Lafayette, IN (US); Qaizar N. Hassonjee, Chadds Ford, PA (US)

(73) Assignee: Textronics, Inc., Chadds Ford, PA (US)

( * ) Notice: Subject to any disclaimer, the term of this patent is extended or adjusted under 35 U.S.C. 154(b) by 1420 days.

(21) Appl. No.: 11/570,313

(22) PCT Filed: Jun. 15, 2005

(86) PCT No.: PCT/IB2005/001686
§ 371 (c)(1),
(2), (4) Date: Dec. 8, 2006

(87) PCT Pub. No.: WO2005/123378
PCT Pub. Date: Dec. 29, 2005

(65) Prior Publication Data
US 2008/0000891 A1 Jan. 3, 2008

Related U.S. Application Data

(60) Provisional application No. 60/581,048, filed on Jun. 18, 2004.

(51) Int. Cl.
*H05B 3/34* (2006.01)
(52) U.S. Cl.
USPC ........... 219/211; 219/212; 219/529; 219/545; 139/421; 139/425 R
(58) Field of Classification Search
USPC .......... 219/211, 212, 529, 545, 549; 429/120; 156/163, 176; 338/208; 139/421, 422, 139/423, 425 R
See application file for complete search history.

(56) References Cited

U.S. PATENT DOCUMENTS

| 975,358 | A | * | 11/1910 | Hefter | 338/208 |
| 3,485,706 | A | | 12/1969 | Evans | |
| 4,822,663 | A | | 4/1989 | Reott | |
| 5,030,495 | A | | 7/1991 | Neu | |
| 5,366,780 | A | * | 11/1994 | Rapisarda | 428/102 |

(Continued)

FOREIGN PATENT DOCUMENTS

| DE | 10020651 | 11/2000 |
| GB | 559322 | 2/1944 |

(Continued)

OTHER PUBLICATIONS

E.R. Post, et al., *E-broidery: Design and Fabrication of Textile-Based Computing* (2000), vol. 39, No. 3 and 4, IBM Systems Journal.

*Primary Examiner* — Dana Ross
*Assistant Examiner* — John Wasaff
(74) *Attorney, Agent, or Firm* — Novak Druce Connolly Bove + Quigg LLP

(57) ABSTRACT

The invention provides a laminate composite fabric which is robust, laundry-durable, and a method for forming such fabric. The laminate fabric is provided with at least one element that provides heat or warmth (heating element). Generally, the laminate fabric with heating element(s) is sufficiently robust for incorporation into garments or warming textile structures (pads and blankets). The laminate fabric may include one or more stretch and recovery elements to cause the laminate to be more adaptable for securing about any three dimensional body.

28 Claims, 12 Drawing Sheets

(56) References Cited

U.S. PATENT DOCUMENTS

| | | |
|---|---|---|
| 5,543,012 A | 8/1996 | Watson et al. |
| 8,906,004 | 5/1999 | Lebby at al. |
| 6,210,771 B1 | 4/2001 | Post et al. |
| 6,315,009 B1 | 11/2001 | Jayaraman et al. |
| 6,341,504 B1 | 1/2002 | Istook |
| 6,381,482 B1 | 4/2002 | Jayaraman et al. |
| 6,687,523 B1 | 2/2004 | Jayaramen et al. |
| 6,933,469 B2 * | 8/2005 | Ellis et al. .................... 219/217 |
| 2001/0001300 A1 | 5/2001 | Tolbert et al. |
| 2001/0019050 A1 | 9/2001 | Rock et al. |
| 2001/0029142 A1 | 10/2001 | Martin |
| 2002/0086204 A1 | 7/2002 | Rock et al. |
| 2004/0127132 A1 | 7/2004 | Berman et al. |
| 2005/0061802 A1 | 3/2005 | Rock |

FOREIGN PATENT DOCUMENTS

| | | |
|---|---|---|
| GB | 2170680 | 8/1986 |
| GB | 2261290 | 5/1993 |
| JP | 42-15347S A | 8/1967 |
| WO | WO-9964657 | 12/1999 |
| WO | WO-0020202 | 4/2000 |
| WO | WO-0245946 | 6/2002 |
| WO | WO-03087451 A2 | 10/2003 |

* cited by examiner

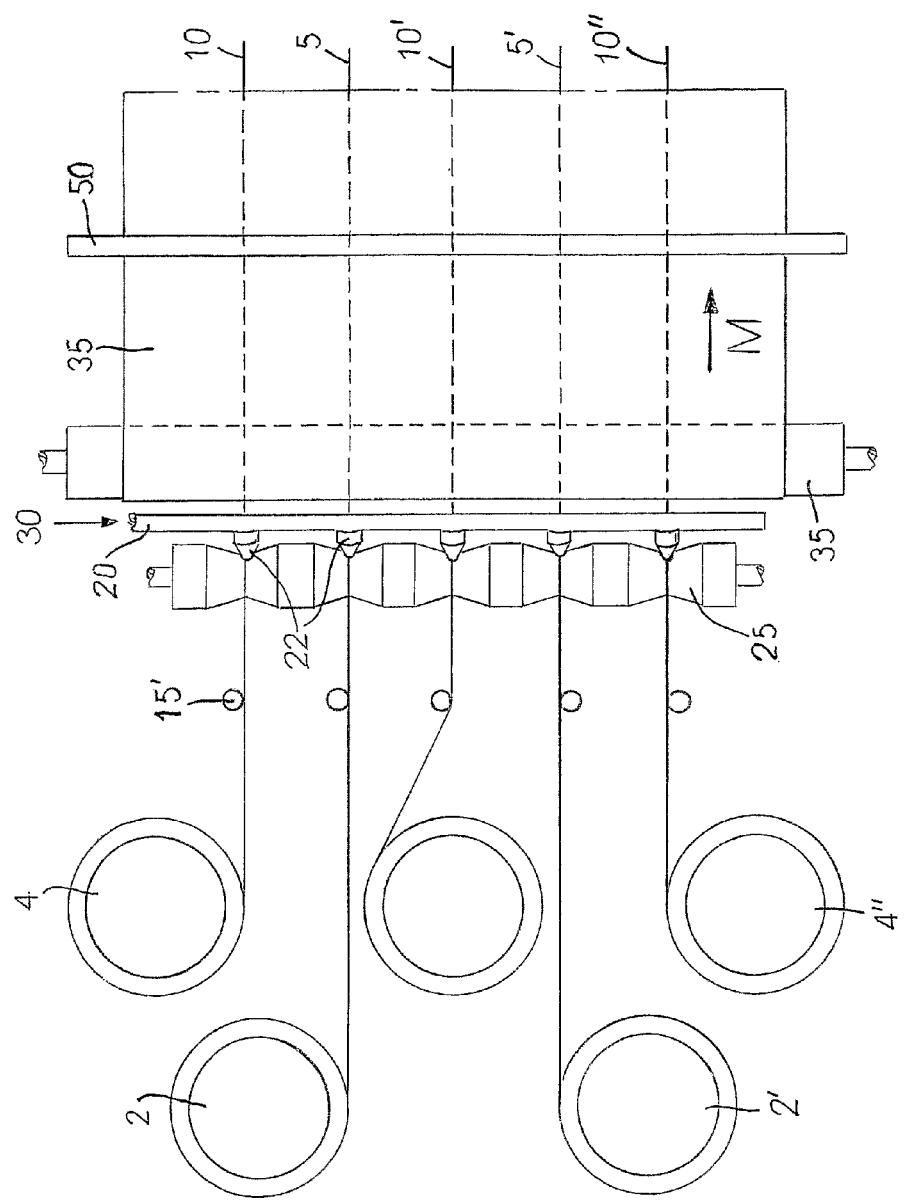

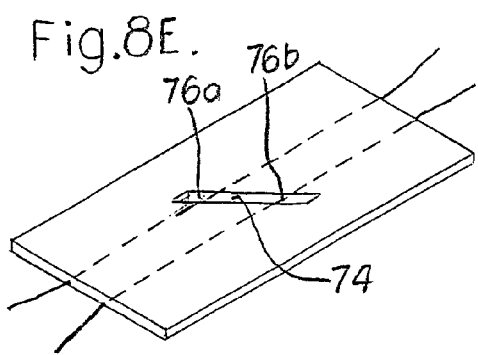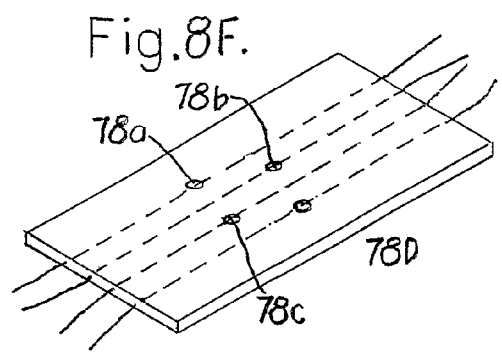

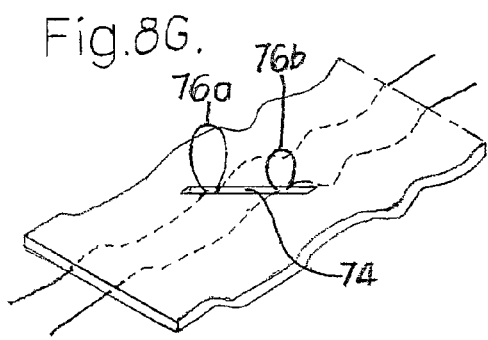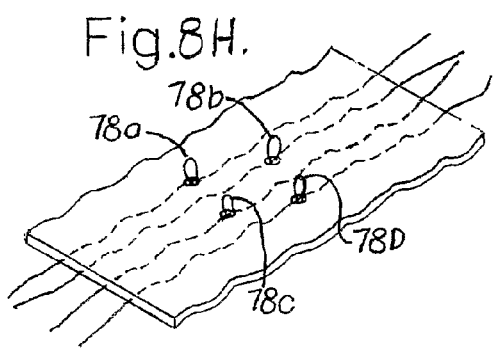

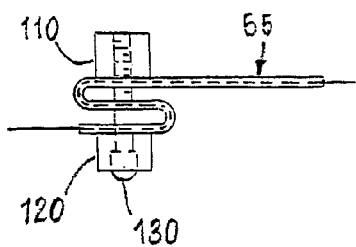
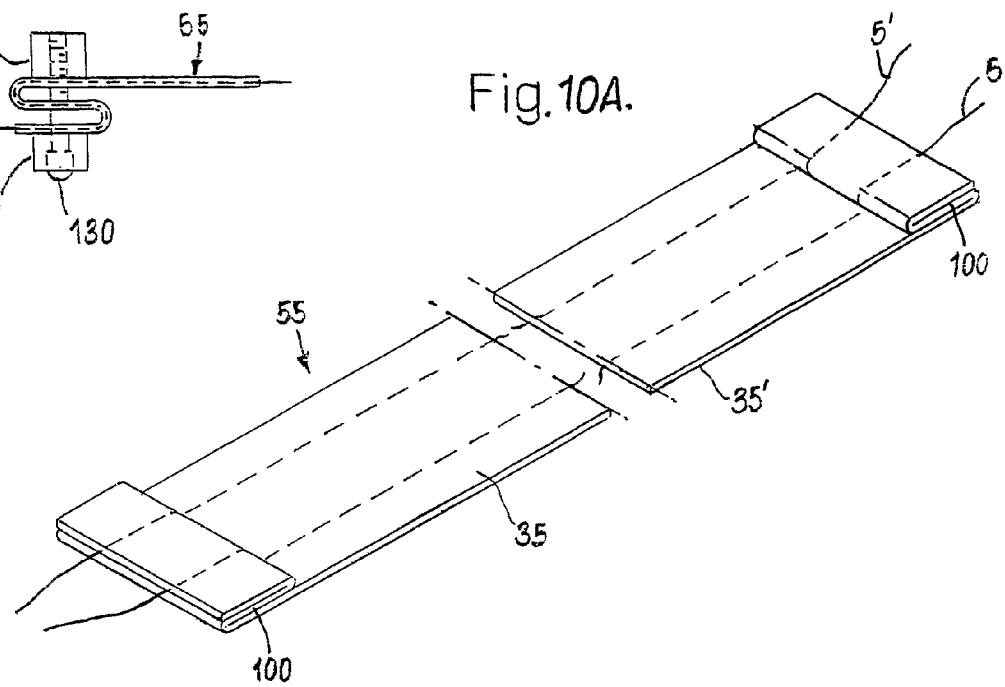

TEXTILE STRUCTURES FOR HEATING OR WARMING

CROSS-REFERENCE TO RELATED APPLICATION

This application is a national stage entry of PCT/IB2005/001686, filed Jun. 15, 2005, which claims priority from U.S. Provisional Application No. 60/581,048, filed Jun. 18, 2004

FIELD OF THE INVENTION

The present invention relates to flexible textile structures, adapted for securing about a three dimensional object, having the ability to provide heat or warmth.

BACKGROUND OF THE INVENTION

Fabrics having an ability to provide heat or warmth have been disclosed. For example, U.S. Published Application No. 2005/0061802 to Rock, discloses a fabric article that generates heat upon application of electrical power. In Rock, an electrical resistance heating element in the form of a conductive yarn is incorporated into a fabric prebody by a knitting or weaving process. The resulting fabric body incorporates the conductive yarn directly into its woven or knitted structure.

PCT publication WO 2003/087451A2 to Vikram Sharma ("Sharma") discloses a tubular knit fabric system comprising an electrically insulating yarn, a stretch yarn, and a "functional" yarn knitted together to form a tubular knit fabric. In Sharma, the functional yarn is electrically conductive, having a resistance of 0.01 ohm/meter to 5000 ohm/meter. The functional yarn is embedded within the tubular knit in a continuous spiral that extends the length of a sleeve formed from the tubular knit. Body portions, such as limbs, are surrounded by a portion of the tubular fabric to measure physiological signs. In addition, these tubular knit fabrics disclosed by Sharma are adaptable for use in a narrow elastic band configuration in which the functional yarns serve as parallel conductors for electrical signals. A disadvantage of Sharms's narrow elastic band structures is that the functional yarns or wires must be knitted simultaneously into the structure with all other components.

The above references incorporate heating elements, such as electrical conductors or resistors, through the use of fabric structures of a woven or knitted type. Such elements can have poor compatibility with conventional textiles. Moreover, such elements generally cause difficulties in conventional fabric forming processes (e.g. weaving, knitting, seamless knitting). For example, wires and small cables often match poorly with typical textile fibers because of their fragility, elastic modulus, extensibility, and tensile strength. In particular, such disadvantages are notable where elastic recovery and flexibility from the structure or garment is desired and where the ability to wash or launder a garment is desired. Thus, flexible textile structures are needed that can overcome one or more deficiencies of the prior art.

The art continues to seek structures with elements able to provide heat or warmth, wherein the structures do not have at least one of the deficiencies mentioned above. An ability to launder fabric structures with heating elements in the same manner as regular garments are laundered would be highly desirable.

SUMMARY OF THE INVENTION

The present invention relates to a laminate with heating or warming properties that may have either a substantially flat or a substantially puckered appearance. The laminate includes: first and second outer layers of a fabric, paper or film; at least one heating element; and an adhesive composition for bonding the heating element between the outer layers. The heating element may be an electrical resistance heating element that is adaptable to being connected to a source of electrical power. The heating element may be a conductive yarn, such as a yarn comprising a core of insulating material with an electrical resistance heating element disposed generally about said core.

Optionally, the functional laminate further includes at least one stretch and recovery element bonded between the outer layers. With such stretch and recovery element, a laminate with a substantially puckered appearance results when the stretch and recovery element is in a relaxed or unstretched state.

A portion of the at least one heating element may be exposed through at least one hole or via provided in the laminate. If the laminate has stretch and recovery properties, a portion of the at least one heating element may extend or loop outwardly from such via.

A garment, wearable, heating pad or electric blanket may incorporate one or more of the laminates according to the invention.

The present invention further relates to a method for preparing a laminate with heating and warming properties. The method includes: providing a length of a first piece of inextensible material having a first surface and a second surface; extending and fixing at least one length of a heating element coextensively with the first piece of inextensible material, and securing the extended length the heating element to the first surface of said first piece of inextensible material along a substantial portion of the fixed length thereof; providing a second piece of inextensible material having a first surface and second surface, and securing said second piece of inextensible material either to the heating element or to the first surface of said first piece of inextensible material along a substantial portion of the length thereof to form the laminate.

If an alternate laminate with stretch and recovery properties is desired, the method further includes extending and fixing at least one length of a stretch and recovery element to at least 50% of its undeformed recoverable extension limit and securing such extended stretch and recovery element to the first surface of said first piece of inextensible material, such that the stretch and recovery element is coextensive with the heating element. Once the first and second pieces of inextensible material are bonded together or bonded to the stretch and recovery element, the extended length of said stretch and recovery element may be substantially relaxed, which allows the functional stretch laminate to pucker. If a hole or via is provided in one of the outer layers of the laminate, a portion of the at least one heating element may extend or loop outwardly from the at least one hole or via.

BRIEF DESCRIPTION OF THE DRAWINGS

The present invention will be described in the following detailed description with reference to the following drawings:

FIG. 2 is a schematic representation in top plan view of a portion of an apparatus for making a laminate of the invention;

in FIG. 7A, the laminate is under an elongating tension, and in FIG. 7B, the laminate is relaxed and under no elongating tension;

FIGS. 8E and 8F are perspective views of laminates wherein portions of the heating elements are exposed through vias or holes in the laminate; in FIG. 8E heating elements are exposed through an elongated slot-shaped perforation, and in FIG. 8F four heating elements are exposed through individual perforation holes;

FIGS. 8G and 8H are perspective views of alternative laminates having stretch and recovery properties wherein portions of the heating elements loop out of one outer layer of the laminate; in FIG. 8G two loops are shown extending through an elongated slot-shaped perforation and in FIG. 8H four loops are shown each extending through individual perforation holes;

in FIG. 9A the laminate is under an elongating tension, and in FIG. 9B the laminate is relaxed and under no elongating tension;

FIG. 10A is a perspective view of a laminate of the invention in which z-folds are formed at each end to stabilize the heating element within the laminate;

FIG. 10B is a cross-sectional view in side elevation of a clamping engagement to provide one possible electrical connection means at the z-fold formed at one end of the laminate of FIG. 10A.

DETAILED DESCRIPTION OF THE INVENTION

Figure 1:
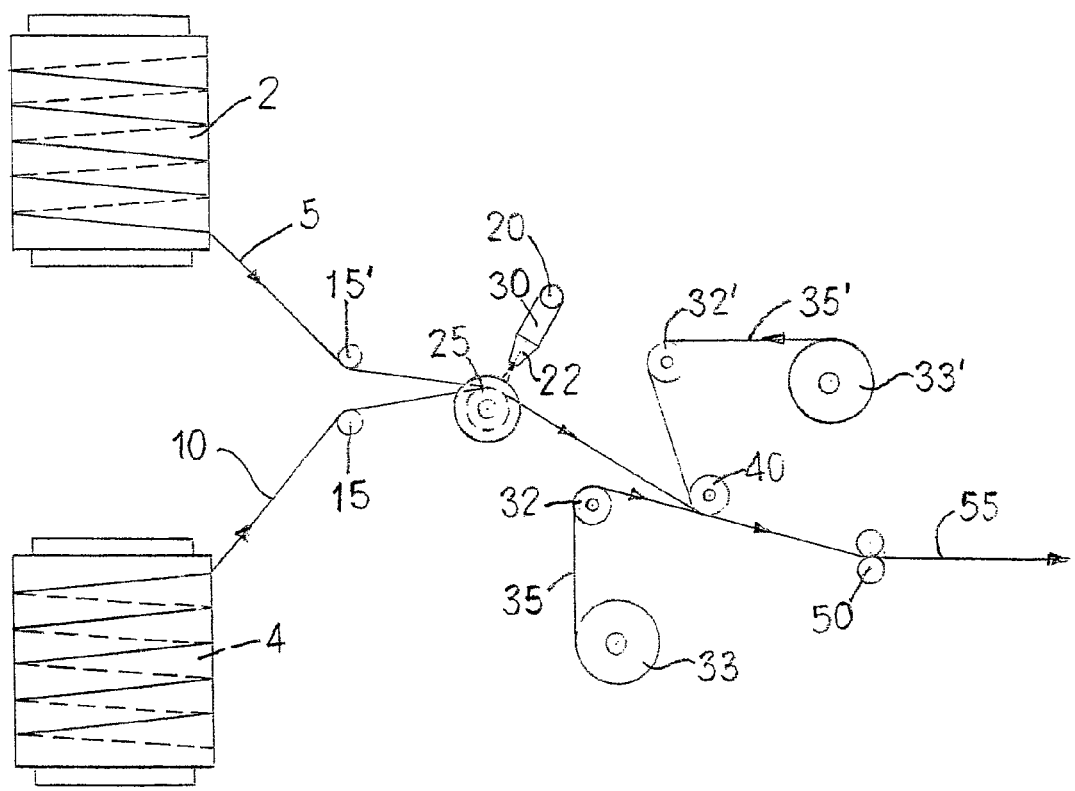
FIG. 1 is a schematic representation in side elevation of an apparatus suitable for making a laminate of the invention.

The invention includes a laminate for heating or warming that may be, in at least one embodiment, a composite fabric with a substantially flat surface appearance, and in at least one other embodiment, is also able to take on a substantially puckered appearance. The laminate can be conductive, robust, laundry-durable, and adapted for securing about any three dimensional body.

The laminate of the invention generally includes:

(a) first and second outer layers of nonwoven, knitted, or woven fabric or film, wherein each layer has an inside (or first) surface and an outside (or second) surface with respect to the composite fabric;

(b) at least one heating element sandwiched between the outer layers; and (c) an adhesive composition for bonding the first and second outer layers, or for bonding the first and second outer layers to the heating element.

The two outer layers of nonwoven, knitted, or woven fabric or film can, in one embodiment, be of substantially equal width.

In at least one embodiment, the laminate can further include at least one threadline of a stretch and recovery element, such as a fiber having elastomeric properties, that is also sandwiched between the outer layers.

The elastomeric fiber can, in a further embodiment, be at least 400 decitex, wherein the number of threadlines and fiber decitex are in a relationship such that the retractive force of the stretchable fabric is at least 0.22 lb/inch (38.9 g/cm).

In addition, the adhesive composition can, in one embodiment, comprise between about 8 and 70% of the laminate by weight, and although applied to only partially cover the inside surface of at least one outer layer, such adhesive may penetrate to the outside of each outer layer to an extent less than about 10%, based on the surface area of each outer layer.

Further, the heating element can be substantially parallel or coextensive with at least one other heating element and/or at least one stretch and recovery element.

In addition, the laminate can be provided with at least one hole or via, which allows for the exposure of at least one heating element. The at least one hole or via can further allow the at least one heating element to extend or loop outwardly from the laminate when the laminate includes at least one threadline of a stretch and recovery element and the laminate is in a relaxed or unstretched state.

The invention further provides a method for making a laminate for heating or warming, which includes the steps of:

providing a length of a first piece of inextensible material having a first surface and a second surface;

extending and fixing at least one length of a heating element coextensively with the inextensible material, and securing the extended length of the heating element to the first surface of said first piece of inextensible material along a substantial portion of the fixed length thereof;

providing a second piece of inextensible material having a first surface and second surface, and securing said second piece of inextensible material either to the heating element or to the first surface of said first piece of inextensible material along a substantial portion of the length thereof coextending with said heating element to form the laminate.

In one embodiment of the inventive method, the outer layers are substantially planarized and secured in place when the at least one heating element is secured to such layers. As used herein, the term "planarizing" means to bring a portion of a fabric, a web, or a film into a substantially planar and unwrinkled configuration without puckers.

In a further embodiment, at least one length of a stretch and recovery element can be extended to at least 50% of its undeformed recoverable extension limit and coextended with the at least one heating element, wherein the extended lengths of the heating element and/or the stretch and recovery element are secured to the first surface of said piece of inextensible material along a substantial portion of the fixed length thereof. After a second piece of inextensible material has been provided and secured to the heating element, the stretch and recovery element, and/or the first surface of said first piece of inextensible material, the extended length of the stretch and recovery element is relaxed substantially, allowing the laminate to pucker.

As used herein, suitable "substantially inextensible materials" include nonwoven fabrics, woven fabrics, knit fabrics, papers, oriented and unoriented films, including variants of the foregoing with metallic coatings. These woven, nonwoven, and knit fabrics may comprise staple or continuous fibers, including those fibers from polyolefins, polyesters, polyamides, and polyperfluorinated olefins. Suitable films may comprise polymers, including polyester, polyolefins, polyperfluorinated olefins, and polyamides. The fabrics or films of the outer layers of the laminate can include any of the above-mentioned substantially inextensible materials.

As used herein, suitable "stretch and recovery elements" include at least spandex or elastane yarns, films, or coatings (for example, LYCRA® spandex). Suitable stretch and recovery elements can further include materials such as a polyester bicomponent fiber, for example, Type 400 brand poly(ethylene terephthalate)//poly(trimethylene terephthalate) bicomponent fiber, commercially available from Invista S. à r. l. ("T400"). Stretch and recovery elements can also include materials that provide both stretch and recovery and functional properties, such as the electrically conductive stretchable composite yarns disclosed in PCT publication WO 2004/097089 A1 (hereinafter referred to as "ETG-1 yarns"), the entire disclosure of which is incorporated herein by reference.

Suitable stretch and recovery elements can have a breaking elongation of over 200%, such as over 400%. In addition, such materials can recover immediately to their original length when tension is relaxed.

As used herein, suitable "heating elements" include electrical resistance heating filaments, such as metal filaments formed of stainless steel (e.g. 316L stainless steel). The filaments may be incorporated into the laminate as is. Typically, however, more than one such filament is wrapped in a sheath material such as a polyester or nylon yarn to form a conductive yarn. In one embodiment, a heating element is a conductive yarn that comprises a core of insulating material, such as a polyester or nylon yarn, about which extends one or more electrical resistance heating filaments, wrapped helically about the core. An outer covering of insulating material is then helically wrapped about the core and the filaments to form such conductive yarn. The core of the conductive yarn and the sheath material of the outer covering over the conductive filaments can be made of synthetic or natural material. In some embodiments, the core and/or sheath are nylon, e.g. about 140 denier nylon, or polyester, e.g., about 600 denier polyester. The outer covering can also have the form of a sleeve, e.g., a dip-coated or extruded sleeve. A conductive yarn without the outer covering may also be used, provided the fabric or film of the laminate structure sufficiently serves to insulate the conductive yarn in the heating or warming laminate.

The heating elements preferably have electrical resistance in the range of about 0.1 to about 500 ohm/cm. In some embodiments, the electrical resistance heating element has electrical resistance of about 190 ohm/m (1.9 ohm/cm), or 250 ohm/m (2.5 ohm/cm). As used herein, the term "adapted for securing about any three dimensional body" means the laminate is flexible, allowing conformance to any shape. Particularly, where the laminate is a garment or a component of a garment or other wearable placed on at least a portion of a body, the laminate is at least as adaptable as the garment or wearable in conforming to the three dimensional shape of the body. Inherent in the adaptable conformance of the laminate to any three dimensional body is a robustness of the laminate structure to maintain the performance of the laminate's heating element in the presence of any motion of the three dimensional shape to which the laminate is conforming.

As used herein, the term "laundry durable" means the laminate is at least washable. Particularly, where the laminate is a component of a washable garment or other washable wearable placed on the body, the laminate structure maintains the performance of the laminate's heating element after multiple washing or laundry cycles. For example, maintaining heating element performance after at least one wash cycle would be "laundry durable."

As used herein, the term "conductive" means at least a portion of the laminate conducts electricity, generates heat, or is able to provide an electromagnetic field.

As used herein, the term "substantially parallel or coextensive" means that the heating element(s) extend lengthwise in the same direction of the laminate (also known as the "machine direction") without contacting an adjacent heating element (and/or stretch and recovery element where the laminate has stretch and recovery properties). Such substantially parallel or coextensive elements can be, in at least one embodiment, substantially equidistant from the other heating elements(s) (and/or stretch and recovery elements) along their length in the direction perpendicular to the direction in which they extend. For example, when a heating element extends in the machine direction of the laminate, then another substantially parallel or coextensive heating element also extends in the machine direction, and both elements are substantially equidistant from each other in the direction perpendicular to the machine direction at points along their length. The term "substantially parallel or coextensive" also includes those situations where both a heating element and a stretch and recovery element are uniformly tensioned in the same direction (such as when both are uniformly tensioned in the machine direction).

The laminate of the invention, in one embodiment, is a composite having varying amounts of puckering, and includes two outer layers of nonwoven fabric and an inner "layer" comprised of at least one heating element and two or more substantially parallel or coextensive elastomeric fibers (stretch and recovery elements) of substantially equal decitex, which are capable of complete recovery from extensions as great as 300%. The elastomeric fibers are substantially relaxed in the absence of externally applied forces. In addition, in a further embodiment, the elastomeric fibers may be equally spaced from each other in the direction perpendicular to their length.

Nonwoven fabrics suitable for making laminates of the invention can have a basis weight ranging from about 10 to about 60 grams/(meter)$^2$, such as from about 10 to about 30 grams/(meter)$^2$. Many types of nonwoven fabrics are suitable for use in embodiments of this invention. Representative examples include nonwovens composed of thermally bonded, spunbonded, and hydroentangled fibers. For example, they may be composed of synthetic polymeric fibers such as polyolefin, polyester, and polyamide fibers.

The laminate of the invention comprises a middle "layer" of at least one heating element sandwiched between the outer layers of inextensible material, such as nonwoven fabrics or films. This middle "layer" may further include, in at least one embodiment, elastomeric fibers of at least one threadline, for example, 3.2 threadlines/cm of width wherein each threadline is at least 400 decitex. The number of threadlines per cm may, for example, be up to about 6.3. The combination of these two parameters (threadlines and dcitex) may, for example, be chosen to provide a minimum retractive force of about 38.9 (grams of force)/cm, as measured in the finished product when it is stretched at 150% of its original length.

The heating element(s) in this middle "layer" may, in one embodiment, be a conductive yarn. The conductive yarn may include, for example, a core of insulating material and an electrical resistance heating element disposed generally around said core. The conductive yarn may further include a sheath material generally surrounding both the electrical resistance heating element and the core. As stated above, the sheath material can, for example, include a yarn that is wrapped around the electrical resistance heating element and the core, or may be a coating.

In addition, the heating element can comprise a conductive yarn, such as of Xstatic® yarn or fiber twisted together with wire, for example, stainless steel filament or wire.

The layers of the laminate are bonded together by an adhesive composition. Each element in the composite should be bonded to at least one other element of the composite. For example, an adhesive may be applied to the heating element, and in turn that element may be adhered to inner surfaces of the outer layers (the adhesive may also be applied to the stretch and recovery element when the laminate has stretch and recovery properties). As another example, an adhesive may be applied to an inner surface of one of the outer layers. The adhesive composition can, for example, constitute from about 8% to 70% of the weight of the composite fabric. Adhesive content in the laminate above these levels may, in certain circumstances, be disadvantageous, as the fabric may bond to itself. Suitable adhesive compositions can, for example, be hot melt adhesives, such as styrene-based block copolymers, including styrene/isoprene and styrene/butadiene block copolymers. Bonding by other methods may be possible, such as flame lamination and laser or ultrasonic welding, if such techniques can be carried out without harming the heating element.

The laminate can, for example, also be prepared in a method whereby uniformly tensioned elastomeric filaments are spaced at substantially equal distances apart and are of substantially equal decitex, for example, no less than 400 decitex per filament, such as about 2,200 dtex threadlines fed in together. These elastomeric filaments are placed between two layers of fabric, such as nonwoven fabric. In one embodiment, at least 3.15 filaments (threadlines) per cm of width are provided. The threadlines can be substantially parallel to each other and to the edges of the nonwoven fabrics. The three layers are bonded with an adhesive, which can be followed by removing the tension immediately after bonding. This method can produce a puckered fabric having a substantially uniform flat surface appearance which results from small substantially uniform puckers.

The apparatus schematically represented in side elevation in FIG. 1 may be used in the process of making laminates falling within the scope of the present invention. FIG. 1 shows supply rolls 2 and 4 of heating elements 5 and 10. However, a plurality of supply rolls and heating elements is also contemplated (see, for example, FIG. 2, which shows supply rolls 2, 2', 4, 4', and 4" of heating elements 5, 5', 10, 10', and 10"). A heating element can, for example, be uniformly tensioned between roll 15 and nip rolls 50 (or roll 15' and nip rolls 50) to provide stability, but generally such heating elements 5 and 10 are not substantially elongated. In FIG. 1, the heating elements 5 and 10 are shown as being side-by-side, and may be separated on any pitch over the roll surface of guide plate 25. Where multiple heating elements are supplied to the process (see FIG. 2 where the machine direction, M, of the process is indicated), it is understood that the guide plate 25 (in FIGS. 1 and 2) or an equivalent spacing means can provide the position and pitch of each heating element. In FIG. 1, a layer of substantially parallel heating elements 5 and 10, are shown as being placed on top of one of the layers of nonwoven fabric 35 supplied from rolls 33. An adhesive 30, for example, a hot melt adhesive, is applied onto the heating elements and bottom nonwoven layer via conduit 20. The other layer of nonwoven 35', supplied from rolls 33', is then placed on top of the adhesive-treated combination at roll 40 and the combined structure is bonded by heat and pressure at nip rolls 50. Alternatively, the adhesive 30 can be applied to the heating elements prior to their placement between layers of nonwoven fabric. When the bonding is completed, the uniform tension is substantially completely released, and the composite fabric relaxes to form the desired structure 55. Arrow D indicates direction of travel of the produced structures 55 away from the nip rolls 50.

Figure 3:
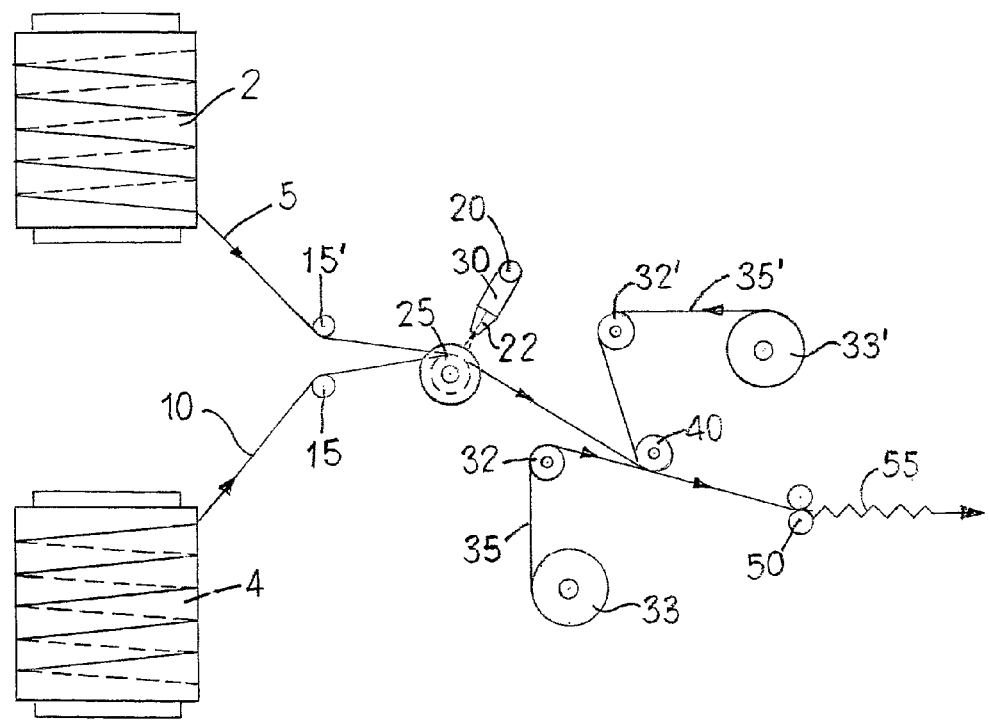
FIG. 3 is a schematic representation in side elevation of an apparatus suitable for making an alternative laminate of the invention having stretch and recovery properties.
Figure 4:
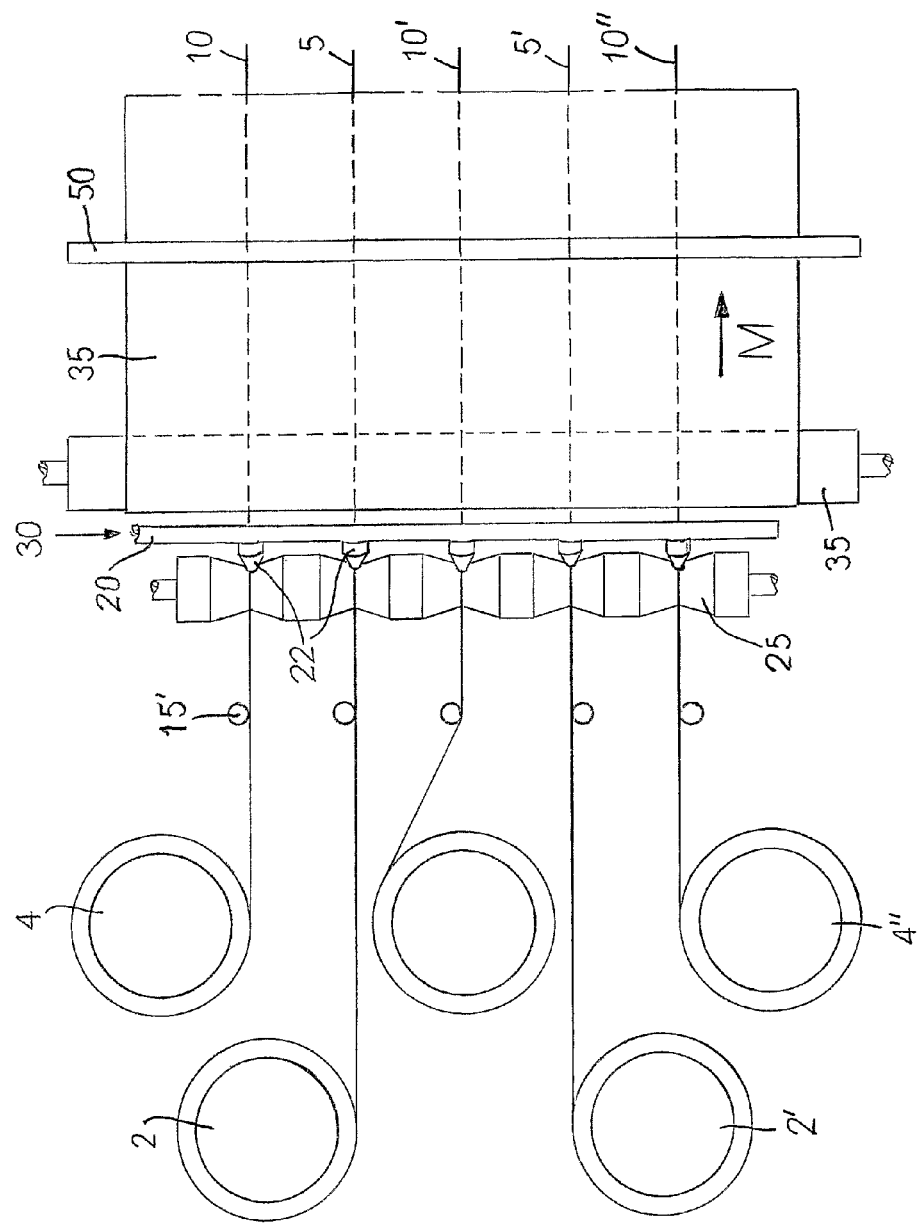
FIG. 4 is a schematic representation in top plan view of a portion of an apparatus for making an alternative laminate of the invention having stretch and recovery properties.
Figure 6:
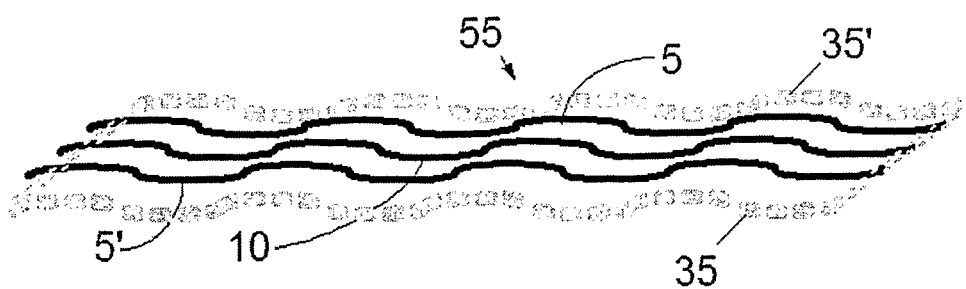
FIG. 6 is a schematic representation of an edge sectional view of a laminate of the invention.

The apparatus schematically represented in side elevation in FIG. 3 may be used in the process of making laminates falling within the scope of the present invention that have stretch and recovery properties. FIG. 3 shows a single supply roll 2 of heating element 5 along with a single supply roll 4 of elastomeric filaments 10. However, a plurality of supply rolls and heating elements is also contemplated (see, for example, FIG. 4, which shows supply rolls 2 and 2' of heating elements 5 and 5' and supply rolls 4, 4', and 4" of elastomeric filaments 10, 10', and 10"). The elastomeric filaments can be uniformly tensioned between roll 15 and nip rolls 50 to provide greater than 50% elongation. A heating element can be uniformly tensioned between roll 15' and nip rolls 50 to provide stability, but generally such heating element 5 is not substantially elongated. In FIG. 3, the single heating element 5 and the single elastomeric filament 10 are shown as being side-by-side and may be separated on any pitch over the roll surface of guide plate 25. Where multiple elastomeric fibers and multiple heating elements are supplied to the process (see FIG. 4 where the machine direction, M, of the process is indicated), it is understood that the guide plate 25 (in FIGS. 3 and 4) or an equivalent spacing means can provide the position and pitch of each elastomeric fiber and heating element. In FIG. 3, a layer of substantially parallel elastomeric fiber 10, stretched not less than 50%, and heating element 5, are shown as being placed on top of one of the layers of nonwoven fabric 35 supplied from rolls 33. An adhesive 30, for example, a hot melt adhesive, is applied onto the elastomeric fiber and heating element and bottom nonwoven layer via conduit 20. The other layer of nonwoven 35', supplied from rolls 33', is then placed on top of the adhesive-treated combination at roll 40 and the combined structure is bonded by heat and pressure at nip rolls 50 while the elastomeric fibers 10 remain in the stretched condition. Alternatively, the adhesive 30 can be applied to the elastomeric fiber and heating element prior to their placement between layers of nonwoven fabric. When the bonding is completed, the uniform tension is substantially completely released and the composite fabric relaxes to form the desired puckered structure 55. Arrow D indicates direction of travel of the produced structures 55 away from the nip rolls 50.

The hot melt adhesive 30 (see, for example, FIGS. 2 and 4) can be applied in several different ways. In one method, the melted adhesive can be deposited as a discontinuous web from a spray nozzle (one such nozzle 22 is shown at the end of adhesive conduit 20 in FIGS. 2 and 4), by a process known as melt blowing. In another method, the melted adhesive can be deposited as a solid stream from a nozzle that moves in a spiral pattern as the web passes, by a process known as spiral spray. A pattern in which the adhesive only partially covers the nonwoven layers, such as is produced by melt-blowing or spiral spray, can result in a uniform, flat surface appearance of the composite fabric. By "only partially covers" it is meant that the adhesive is present at one part of the nonwoven but absent at an adjacent part. This can also be accomplished by applying a "dot matrix" pattern.

Figure 5A:
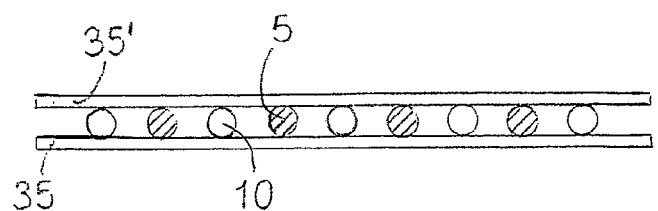
FIGS. 5A and 5B are schematic representations in cross-section of a laminate of the invention, illustrating a sandwich of heating elements between two fabrics or sheets of other inextensible material.
Figure 5B:
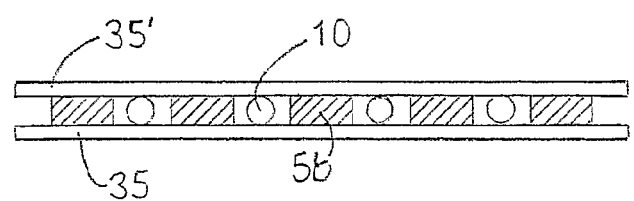

FIG. 5A and FIG. 5B illustrate laminate structures with different heating elements 5 and 5b. In FIG. 3A, heating element 5 is a wire or filament. In FIG. 3B, heating element 5b is ribbon wire.

Figure 5C:
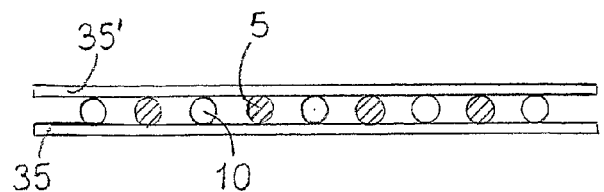
FIGS. 5C and 5D are schematic representations in cross-section of a laminate of the invention, illustrating a sandwich of heating elements and stretch and recovery elements between two fabrics or sheets of other inextensible material.
Figure 5D:
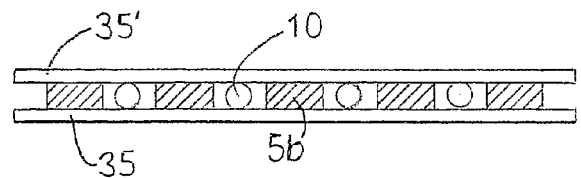

FIG. 5C and FIG. 5D illustrate laminate structures having stretch and recovery properties with different heating elements 5 and 5b. In FIG. 5C. heating element 5 is a wire or filament. In FIG. 5D, heating element 5b is ribbon wire. In FIGS. 5C and 5D, elastomeric fibers 10 are as in FIGS. 3 and 4 and are shown as alternating with the wires 5 and 5b. In FIGS. 5A-5D, nonwoven fabrics 35 and 35' are as described for FIGS. 1-4.

Figure 7A:
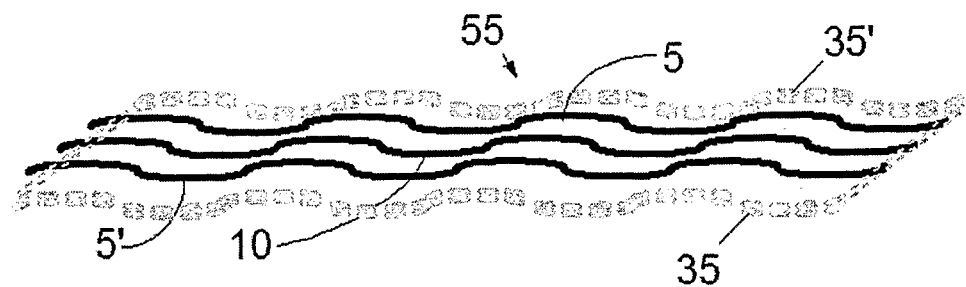
FIGS. 7A and 7B are schematic representations of an edge sectional view of an alternative laminate of the invention having stretch and recovery properties.
Figure 7B:
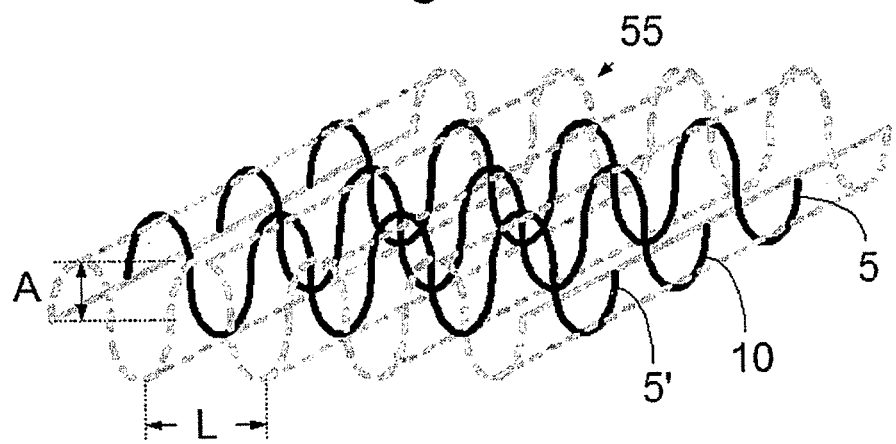

When the laminates of the invention contain stretch and recovery elements, their flatness or smoothness can be determined by measuring the change in thickness when the laminate is stretched from its relaxed state to its ultimate elongation. Generally, the smoother the appearance of the fabric, the smaller the change in thickness on stretching. Alternatively, one can count the number of raised portions, referred to as puckers, per linear cm (inch) of the relaxed laminate fabric (L in FIG. 7B shows a distance between puckers). Starting from a given extended length, as the number of puckers increases in the relaxed fabric, the amplitude (A in FIG. 7B) of each pucker decreases. The ratio of these the two values, amplitude (A) and puckers per linear fixed length (L) (see FIG. 7B), i.e., the ratio of percent decrease in thickness to the number of puckers per inch, is referred to as the "flatness factor." The laminate can be considered "flat" or "smooth" when the flatness factor is less than about 5.

Thickness measurements can be made with an Ames Thickness Gage. Thickness can be measured on the relaxed composite fabric at three different places and the measurements averaged. The fabric can then be stretched to the fullest extent possible. While stretched, the thickness can again be measured at three different places and the results can be averaged. From the difference in thickness values, percent decrease in thickness can be calculated.

The number of puckers per linear fixed length for the conductive stretch laminate can be determined by placing a ruler along the length of the fabric parallel to the edge of the fabric. The number of puckers in a fixed length can be counted. This can be repeated at two other locations across the width of the fabric to determine an average.

The laminate may be "laundry durable" meaning that it can undergo at least one laundry cycle without showing evidence of delamination of the outer layers (whether polypropylene or polyester fiber-based nonwovens), which would indicate loss of bonding between the heating element(s) and the outer layers. The laminate may also be disposable, for example, when at least one of the outer layers comprises paper.

The laminate fabric may, in certain embodiments, be further characterized by laundry durability such that it can undergo at least about 28 laundry cycles without showing evidence of delamination of the outer layers. To demonstrate such durability, the following laundry cycle can be used: 30-minute warm wash/warm rinse with 38-41° C. (100-105° F.). water and 50 g of "Tide" detergent in a Sears Kenmore Series 80 washer, followed by drying on the "normal/permanent press/medium" setting (up to 96° C. [(205° F.]) in a Sears Kenmore Series 80 dryer.

The laundry durability of these laminate fabrics can be provided by using selected adhesives having a complex viscosity at 120° C. of: (i) at least about 25 pascal seconds (250 poise) when the outer layers comprise nonwoven fabric that comprises polypropylene fibers; and (ii) at least about 200 pascal seconds (2,000 poise) when the outer layers comprise nonwoven fabric that comprises polyester fibers.

The absolute value of the complex viscosity is defined as follows: At a given frequency, ω, and shear stress, σ, the absolute value of the complex viscosity, $|\eta^*|$, is the square root of the sum of the squares of the elastic, (G'), and viscous, (G"), moduli divided by the frequency:

$$|\eta^*| = \sqrt{G'^2 + G''^2}/\omega$$

The softening point of useful adhesives can generally be expected to exceed 90° C. (194° F.), and suitably can generally be expected to exceed 110° C. (230° F.).

Examples of adhesives useful in making laundry durable laminate fabrics include those that contain styrene-based block copolymers, which may also contain additives, such as tackifying agents and processing oils. Where the nonwoven fabrics comprise polypropylene fibers, the adhesives can include HL-1486 and HL-1470 (H. B. Fuller Company), and H-2104, H-2494. and H-2385 (Bostick, Inc., Milwaukee, Wis.). Where the nonwoven fabrics comprise polyester and/or polypropylene fibers, the adhesives can include H-2385 (Bostick, Inc., Milwaukee, Wis.) and NS-34-3260, NS-34-3322, and NS-34-5640 (National Starch Company). All of the above-named adhesives contain styrene-based block copolymers. The complex viscosity of selected adhesives that are useful in making the laundry-durable laminate fabrics of the invention are disclosed in EP1 128 952 B1 (granted 20031126 and assigned to E. I. DuPont de Nemours and Co.), the entire disclosure of which is incorporated herein by reference.

Figure 8A:
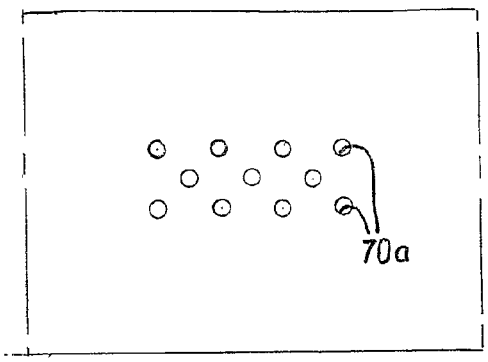
FIGS. 8A-8D are top plan views of perforation patterns that may be used to form perforations in an outer sheet of the composite laminate to expose heating elements.
Figure 8B:
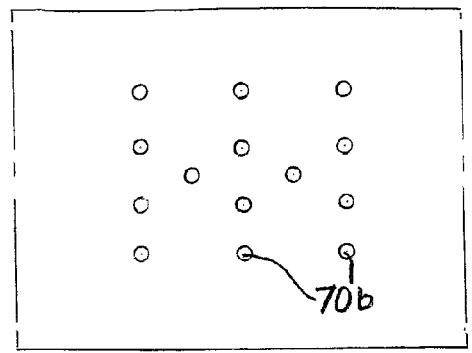
Figure 8C:
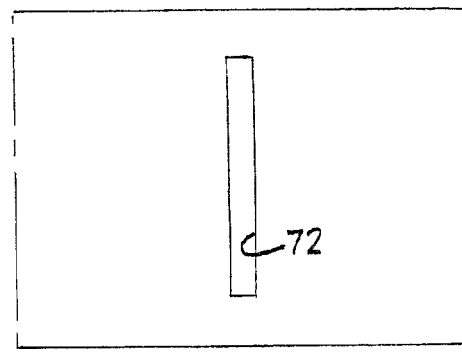
Figure 8D:
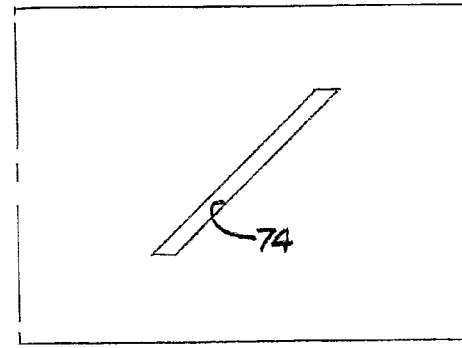

FIGS. 8A through 8D are top plan views of perforation patterns that may be used in conjunction with the invention. In FIG. 8A, a series of eleven round hole perforations 70a are formed in a regular grid pattern. In FIG. 8B, a series of fourteen round hole perforations 70b are formed in an alternate regular grid pattern. In FIG. 8C, a rectangular slot perforation 72 is shown, oriented with its longest side generally perpendicular to the lengthwise-extension of the sheet holding such pattern and thus generally perpendicular to the extended length of the heating element. In FIG. 8D, a trapezoidal slot perforation 74 is shown, oriented at a slant with respect to the lengthwise extension of the sheet holding such pattern. The pattern sheets in FIGS. 8A to 8D are representative of the types of patterns that may be employed. Other advantageous patterns may be designed to meet specific requirements. Preferably, the patterns are cut through one outer layer of the laminate, either while the layer is held in a planarized and fixed position or prior to assembling such layer within the laminate. Optionally, such patterns may be cut through both outer layers of the laminate.

As shown in FIG. 8, the perforations can, for example, be geometric shaped rectangles or circular cross-sectionally shaped holes obtained by a "hole-punching" means. Any cross-sectional shape is generally suitable and is readily provided by a hole punch die having the desired shape. Hole-punching means can, for example, include a hand held device, which produces a single hole, and a 3-hole paper punch used to make 3-ring binder holes in paper. In general, such hole-punching means are used in a step-and-repeat fashion to make a series of holes of a fixed spacing interval in the non-woven.

Alternatively, the non-woven sheet may be fed through a dedicated hole punching apparatus capable of hole punching on a fixed spacing interval or on a randomly spaced interval selected by the operator. Alternately, the non-woven sheet may be scored. The non-woven sheet, so perforated, can be wound up in a conventional manner to then be mounted in an apparatus (such as that shown in FIG. 1, in either or both of positions denoted as 33 or 33'). In an alternative embodiment, vias can be cut in any shape directly into multiple layer depths of an un-wound roll. The perforated non-woven can then used to form a laminate.

FIGS. 8E and 8F are perspective views of laminates wherein portions of the heating elements are exposed through vias or holes in one outer layer of the laminate. In FIG. 8E, heating elements, 76a and 76b, are exposed through an elongated slot-shaped perforation 74. In FIG. 8F, four heating elements, 78a, 78b, 78c, and 78d, are shown each exposed through an individual perforation hole.

FIGS. 8G and 8H are perspective views of laminates having stretch and recovery properties wherein portions of the heating elements loop out of one outer layer of the laminate. In FIG. 8G, two loops, 76a and 76b, are shown extending through an elongated slot-shaped perforation 74. In FIG. 8H, four loops, 78a, 78b, 78c, and 78d, are shown each extending through an individual perforation hole.

Figure 9A:
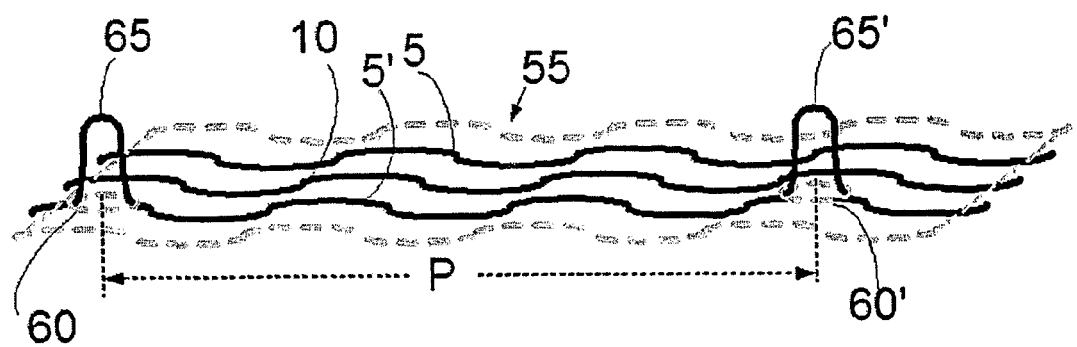
FIGS. 9A and 9B are schematic representations of an edge sectional view of an alternative laminate of the invention having both stretch and recovery properties as well as vias or perforations provided in the laminate structure.
Figure 9B:
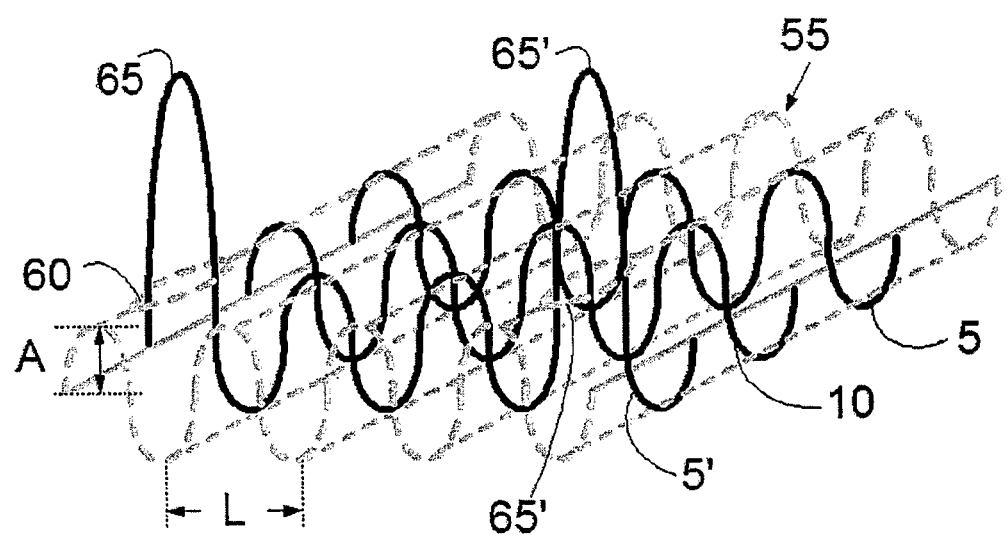

Referring next to FIGS. 9A and 9B, in embodiments comprising both stretch and recovery elements and vias, the perforations 60 and 60' in the outer layer create openings through which the heating elements may be exposed upon releasing tension and relaxing the laminate structure. Heating elements 5 and 5' within the laminate form loops 65 and 65' along portions of the length of the laminate. The heating elements 5 and 5' are coextensive with stretch and recovery element 10. The stretch laminate 55 is provided with perforations 60 and 60' in one of the nonwoven layers. These perforations are separated by a distance P which is defined for the laminate while under elongating tension. Any number of perforations 60, 60' may be present in one or both of the nonwoven layers. Generally, the distance P, separating perforations, is fixed along any portion of the total length of the laminate. The distance P may be tailored to provide access to one or more heating elements at chosen fixed intervals. Optionally, both nonwoven layers may contain perforations 60 and 60', which allow looping out of the heating elements 5 and 5' on opposing sides of the laminate. In FIGS. 9A and 9B the composite fabrics are shown in schematic representation in a relaxed state under no elongating tension. The looping out portions 65 and 65' of the heating elements 5, 5' extend a greater distance from the laminate under no elongating tension.

The degree that looping out portions 65 and 65' can project away from a via is at least, in part, a function of the bending modulus of the heating element. Heating elements with higher bending modulus can dramatically protrude from the via as the stretch laminate 55 structure is relaxed. In contrast, softer heating elements with a lower bending modulus tend to remain in the plane of the non-woven, i.e., resting in the via for ease of access or termination.

FIG. 10A is a perspective view of a laminate 55 of the invention comprised of two nonwoven fabrics, 35 and 35', and having two heating elements, 5 and 5', and including a folded over portion 100 or z-fold at each end. The folded over portion 100 functions as a strain relief, to help maintain the heating elements within the laminate structure.

The folded over portion 100 also permits a connector means to be clamped about the folded over portion. In FIG. 10B, an end portion of a laminate is represented in cross-section includes a clamping means comprising a first portion 110 and a second portion 120. The first portion 110 of the clamping means is provided with at least a pair of threaded holes each adapted to receive the threads of a bolt 130, which passes through the second portion of the clamping means 120 and engages the threads of portion 110. In FIG. 10B, the two portions of the clamping means 120 and 110, represented in cross-section, are completely engaged by means of the threaded bolts and provide a tight clamping of the folded over portion of laminate 55. Alternate holding means include a mechanical fastening mechanism selected from the group consisting of gluing, riveting, snapping, stitching, stapling, welding, and encasing to hold or maintain the z-fold at the end of the laminate 55.

Figure 11B:
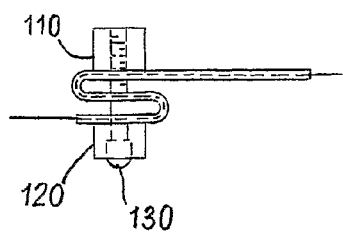
FIG. 11 is a perspective view of an alternative laminate with stretch and recovery properties in which z-folds are formed at each end to stabilize the heating elements within the laminate.
Figure 11A:
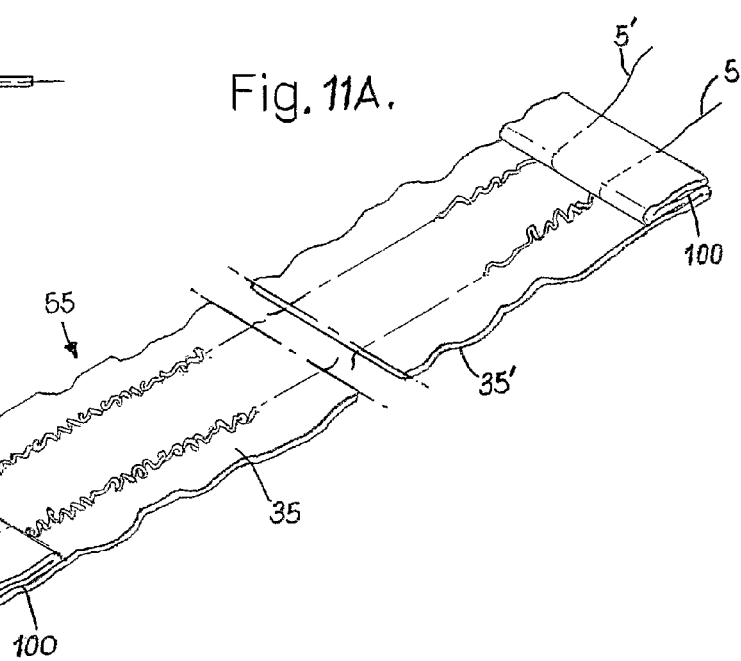

FIG. 11 shows a similar laminate to that of FIG. 10A, with the exception that the laminate 55 in this illustration is a stretch laminate that has a puckered appearance due to the relaxation of at least one stretch and recovery element incorporated in the laminate.

The laminates of this invention may be formed as garments or components of garments, or as heating pads or heating blankets or components of heating pads or heating blankets. The laminates may be in the form of a tape or band that may be integrally formed as a band or cuff or may be sewn or adhered as a component of a textile structure.

Nothing in this specification should be considered as limiting the scope of the present invention. All examples presented are representative and non-limiting. The above described embodiments of the invention may be modified or varied, and elements added or omitted, without departing from the invention, as appreciated by persons skilled in the art in light of the above teachings. It is therefore to be understood that the invention is to be measured by the scope of the claims, and may be practiced in alternative manners to those which have been specifically described in the specification.

The invention claimed is:

1. A laminate for heating or warming, comprising:
   (a) a first outer layer of an inextensible material defining an inner surface and an outer surface opposite the inner surface;
   (b) a second outer layer of an inextensible material defining an inner surface and an outer surface opposite the inner surface, wherein at least one of the first and second outer layers defines one or more predetermined punched holes therethrough;
   (c) at least one heating element coextending with the first and second outer layers and interposed between inner surfaces of said first and second outer layers so as to be sandwiched therebetween, said at least one heating element being intermingled, twisted, core spun, or covered together with: (i) at least one other heating element; or (ii) a material having stretch and recovery properties;
   (d) at least one stretch and recovery element spaced apart from, coextending and substantially parallel with the heating element and interposed between the first and second outer layers;
   (e) at least one loop, formed of a portion of the at least one heating element, that extends through the one or more predetermined punched holes above a plane defined by one of said outer surfaces as said stretch and recovery element is in a relaxed or unstretched state; and
   (f) an adhesive composition for bonding the heating element and stretch and recovery element as a middle layer of the laminate between the outer layers to form the laminate.

2. The laminate of claim 1, wherein the laminate comprises at least two heating elements that are substantially parallel or coextensive.

3. The laminate of claim 1, wherein the at least one heating element is an electrical resistance heating element that is adaptable to being connected to a source of electrical power.

4. The laminate of claim 3, wherein the electrical resistance heating element comprises a conductive yarn, said conductive yarn comprising a core of insulating material and an electrical resistance heating element disposed generally about said core.

5. The laminate of claim 4, wherein the conductive yarn further comprises a sheath material generally surrounding said electrical resistance heating element and said core.

6. The laminate of claim 5, wherein the sheath material is comprised of a yarn that is wrapped around the electrical resistance heating element and the core.

7. The laminate of claim 1, wherein the outer layers are selected from the group consisting of nonwoven fabric, woven fabric, knit fabric, paper, and polymer film.

8. The laminate of claim 1, wherein each outer layer has an outer surface and wherein a distal end of the laminate is folded back onto itself at least one time and such folded end is fastened to the outer surface of one outer layer.

9. The laminate of claim 8, wherein the folded end is fastened by a mechanical fastening mechanism selected from the group consisting of gluing, riveting, snapping, stitching, stapling, welding, and encasing.

10. The laminate of claim 3, wherein the source of electric power comprises a battery.

11. The laminate of claim 1, wherein the stretch and recovery element comprises spandex.

12. A method for making a laminate for warming or heating, comprising:
providing a length of a first piece of inextensible material having a first surface and a second surface;
extending and fixing at least one length of a heating element coextensively along the length of the inextensible material, said at least one heating element being intermingled, twisted, core spun, or covered together with: (i) at least one other heating element; or (ii) a material having stretch and recovery properties;
securing the extended length of the heating element to the first surface of said first piece of inextensible material along a substantial portion of the fixed length thereof;
extending to at least 50% of its undeformed recoverable extension limit and fixing at least one length of a stretch and recovery element coextensively along the length of the first piece of inextensible material and spaced apart from and substantially parallel with the at least one length of a heating element;
securing the extended length of the stretch and recovery element and the extended length of the heating element to the first surface of said first piece of inextensible material along a substantial portion of the fixed length of the first piece of inextensible material;
providing a second piece of inextensible material having a first surface and second surface;
securing said second piece of inextensible material either to the heating element or to the first surface of said first piece of inextensible material along a substantial portion of the length thereof coextending with said heating element to form the laminate, wherein one or both of said first piece of inextensible material and said second piece of inextensible material defines at least one punched hole therethrough;
after the second piece of inextensible material is secured, relaxing the extended length of said stretch and recovery element substantially and allowing the laminate to pucker, exposing the at least one heating element through the at least one punched hole provided in at least one of the first piece of inextensible material or second piece of extensible material; and
forming a loop in a portion of the at least one heating element that extends outwardly above a plane defined by the second surface of one of said pieces of inextensible material through the at least one punched hole in said one piece of inextensible material.

13. The method of claim 12, wherein at least two lengths of heating elements are extended and fixed to be substantially parallel or coextensive.

14. The method of claim 12, wherein the at least one heating element is an electrical resistance heating element that is adaptable to being connected to a source of electrical power.

15. The method of claim 14, wherein the electrical resistance heating element comprises a conductive yarn, said conductive yarn comprising a core of insulating material and an electrical resistance heating element disposed generally about said core.

16. The method of claim 15, wherein the conductive yarn further comprises a sheath material generally surrounding said electrical resistance heating filament and said core.

17. The method of claim 16, wherein the sheath material is comprised of a yarn that is wrapped around the electrical resistance heating element and the core.

18. The method of claim 14, further comprising the step of connecting the electrical resistance heating element to the source of electric power in the form of a battery.

19. The method of claim 12, wherein at least the first piece of inextensible material is a fabric or film selected from the group consisting of nonwoven fabric, woven fabric, knit fabric, paper, and polymer film.

20. The method of claim 12, further comprising the steps of: (i) folding a distal end of the laminate back onto itself at least one time; and (ii) fastening such folded end to an outer surface of one outer layer.

21. The method of claim 20, wherein fastening is by a mechanical fastening mechanism selected from the group consisting of gluing, riveting, snapping, stitching, stapling, welding, and encasing.

22. The method of claim 12, wherein the stretch and recovery element comprises spandex.

23. The method of claim 12, wherein at least one heating element and the at least one stretch and recovery element are substantially parallel or coextensive when extended and fixed.

24. The method of claim 14, further comprising the step of connecting the electrical resistance heating element to the source of electric power in the form of a battery.

25. A garment or wearable incorporating the laminate of claim 1.

26. A blanket or heating pad incorporating the laminate of claim 1.

27. The laminate of claim 1, wherein at least one predetermined punched hole is provided in each of the first and second outer layers.

28. The laminate of claim 2, wherein the laminate comprises at least two stretch and recovery elements, and the heating elements alternate with the stretch and recovery elements.

* * * * *